(12) United States Patent
Dhani Reddy et al.

(10) Patent No.: US 10,600,474 B2
(45) Date of Patent: Mar. 24, 2020

(54) WRITE ASSIST

(71) Applicant: GLOBALFOUNDRIES INC., Grand Cayman (KY)

(72) Inventors: Sreenivasula Reddy Dhani Reddy, Bangalore (IN); Sreejith Chidambaran, Kerala (IN); Binu Jose, Pune (IN); Venkatraghavan Bringivijayaraghavan, Cheyyar (IN)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/424,605

(22) Filed: May 29, 2019

(65) Prior Publication Data

US 2019/0279708 A1    Sep. 12, 2019

Related U.S. Application Data

(62) Division of application No. 15/891,619, filed on Feb. 8, 2018, now Pat. No. 10,381,069.

(51) Int. Cl.
| | |
|---|---|
| *G11C 11/419* | (2006.01) |
| *G11C 11/412* | (2006.01) |
| *G11C 11/408* | (2006.01) |
| *G11C 7/12* | (2006.01) |
| *H03K 19/1776* | (2020.01) |

(52) U.S. Cl.
CPC ............. *G11C 11/412* (2013.01); *G11C 7/12* (2013.01); *G11C 11/4085* (2013.01); *G11C 11/419* (2013.01); *H03K 19/1776* (2013.01)

(58) Field of Classification Search
CPC .................................................... G11C 11/412
USPC ........................................................... 365/156
See application file for complete search history.

(56) References Cited

U.S. PATENT DOCUMENTS

| | | |
|---|---|---|
| 8,045,402 B2 | 10/2011 | Yeung |
| 8,363,484 B2 | 1/2013 | Chandra et al. |
| 9,105,315 B2 | 8/2015 | Hold et al. |
| 9,123,439 B2 | 9/2015 | Pilo |
| 9,177,633 B2 | 11/2015 | Roy et al. |
| 9,236,116 B1 | 1/2016 | Braceras et al. |

(Continued)

OTHER PUBLICATIONS

Koo et al., "A 0.094um2 High Density and Aging Resilient 8T SRAM with 14nm FinFET Technology Featuring 560mV VMIN with Read and Write Assist," Symposium on VLSI Circuits Digest of Technical Papers, 2015, pp. C266-C267.

(Continued)

*Primary Examiner* — Jason Lappas
(74) *Attorney, Agent, or Firm* — Gibb & Riley, LLC; Michael J. LeStrange, Esq.

(57) ABSTRACT

A circuit includes a core having a memory array. The memory array includes memory cells and bitlines, and is arranged in columns. The core includes a metallization layer having connections to the memory array, which is devoid of memory cells. Digit lines are connected to the bitlines of a column of the memory array. A write driver is connected to the digit lines. A write assist circuit is connected to the write driver. The write assist circuit maintains a voltage on the digit lines prior to write operations and provides a boost voltage to the digit lines during write operations. A wire bridge located in the metallization layer of the core connects the write assist circuit to the write driver.

20 Claims, 8 Drawing Sheets

(56) References Cited

U.S. PATENT DOCUMENTS

| | | |
|---|---|---|
| 9,496,025 B2 | 11/2016 | Chandra et al. |
| 9,501,607 B1 | 11/2016 | Arsovski et al. |
| 9,542,998 B1 | 1/2017 | Akhilesh et al. |
| 9,548,104 B1 | 1/2017 | Braceras et al. |
| 9,570,156 B1 | 2/2017 | Braceras et al. |
| 9,582,388 B2 | 2/2017 | Liu et al. |
| 9,847,119 B2 | 12/2017 | Chandra et al. |
| 2015/0146479 A1* | 5/2015 | Pilo ............... G11C 11/419 365/156 |
| 2017/0294223 A1 | 10/2017 | Zhang et al. |

OTHER PUBLICATIONS

Pilo et al., "An SRAM Design in 65-nm Technology Node Featuring Read and Write-Assist Circuits to Expand Operating Voltage" IEEE Journal of Solid-State Circuits, vol. 42, No. 4, Apr. 2007, pp. 813-819.

Pilo et al., "An SRAM Design in 65nm and 45nm Technology Nodes Featuring Read and Write-Assist Circuits to Expand Operating Voltage," IEEE, Feb. 20, 2007, Abstract.

U.S. Appl. No. 15/891,619, Restriction Requirement dated Mar. 20, 2019, pp. 1-6.

U.S. Appl. No. 15/891,619, Notice of Allowance dated May 2, 2019, pp. 1-8.

Taiwanese Application No. 108100702, Examination Report dated Nov. 4, 2019 and Search Report dated Sep. 23, 2019, pp. 1-7.

* cited by examiner

WRITE ASSIST

CROSS-REFERENCE TO RELATED APPLICATIONS

This application claims the benefit under 35 U.S.C. § 120 as a divisional of U.S. patent application Ser. No. 15/891,619, filed on Feb. 8, 2018, now U.S. Pat. No. 10,381,069, which issued on Aug. 13, 2019, the entire teachings of which are incorporated herein by reference.

BACKGROUND

The present disclosure relates to semiconductor structures, and, more specifically, to memory cells with write-assist structures and methods of use.

Random access memory (RAM) may be static or dynamic. Static random access memory (SRAM) is a type of semiconductor memory used in many integrated circuit applications, which uses bi-stable latching circuitry to store each bit. SRAM is a desirable type of memory due to its high-speed, low power consumption, and simple operation. The term static differentiates it from dynamic random access memory (DRAM), which must be periodically refreshed. Unlike DRAM, SRAM does not need to be regularly refreshed to retain the stored data.

A typical SRAM cell includes a pair of cross-coupled inverters that hold a desired data bit value (i.e., either a 1 or a 0) and the complement of that value. An SRAM cell has three different states: standby, read and write. In order for the SRAM to operate in read mode and write mode, it should have "readability" and "write stability" respectively. Readability of an SRAM cell is the ability to drive a required signal magnitude onto the bitline within a specified time allocated for signal development and is a function of the read current of the cell. Typically, write operations limit the cycle time in an SRAM. A conventional write driver may have write assist with a stack of transistors for discharging the bitline (BL). The greater the number of transistors in the path of the BL to the write driver, the slower will be the pull down of the BL during write operations. With higher numbers of cells per bitline, the RC time constant associated with the bitline aggravates this issue even further.

In SRAM, write assist may be needed to improve the ability to write to a memory cell at low voltages. Enabling write assist at higher voltages (>0.9v), however, may be a reliability concern, so write assist is typically enabled only at lower voltages (<0.7v). Conventional write assist impacts the cycle time even when it is not enabled due to the additional transistor device it adds to the write driver pull down stack. Furthermore, conventional write assist is tightly integrated to current circuit designs, such that changes may result in an area penalty even when it is not used for write operations. That is, the circuit design would have to be extensively reworked to strip out the write assist and save area. Accordingly, there remains a need for a write assist circuit that can be added as an extra block of logic to an already existing design without circuit disruption.

SUMMARY

Devices and methods herein provide a hybrid-stack write driver that is integrated with the charge pump. In the hybrid-stack write driver, the bitline is pulled to ground primarily by a two-stack device. For write assist, there is an alternate three-stack path. This improves the pull down time for the bitline and attains high performance.

According to an exemplary circuit herein, the circuit may include a core having a memory array. The memory array includes memory cells and bitlines, and is arranged in columns. The core includes a metallization layer having connections to the memory array, which is devoid of memory cells. Digit lines are connected to the bitlines of a column of the memory array. The digit lines are connected to the bitlines through column muxing NMOS transistors. A write driver is connected to the digit lines. A write assist circuit is connected to the write driver. The write assist circuit maintains a voltage on the digit lines prior to write operations and provides a boost voltage to the digit lines during write operations. A wire bridge located in the metallization layer of the core connects the write assist circuit to the write driver.

According to devices herein, a device includes a core having a memory array. The memory array includes memory cells and bitlines, and is arranged in columns. The core includes a metallization layer having connections to the memory array, which is devoid of memory cells. Digit lines are connected to the bitlines of a column of the memory array. The digit lines are connected to the bitlines through column muxing NMOS transistors. A write driver is connected from a first digit line and a second digit line to each of the memory cells of the memory array. The write driver includes a first transistor connected from the first digit line to ground and a second transistor connected from the second digit line to ground. A write assist circuit is connected to the write driver by a wire bridge located in the metallization layer of the core. The write assist circuit includes a first precharge transistor connected to the first digit line, a second precharge transistor connected to the second digit line, a first boost signal connected to the first digit line, and a second boost signal connected to the second digit line. The first precharge transistor maintains a first voltage on the first digit line prior to write operations and the second precharge transistor maintains a second voltage on the second digit line prior to write operations. The first boost signal provides a first boost voltage to the first digit line during write operations and the second boost signal provides a second boost voltage to the second digit line during write operations.

According to some methods herein, a core is provided having a memory array. The memory array includes memory cells and bitlines, and is arranged in columns. The core also includes a metallization layer with connections to the memory cells, but the metallization layer is devoid of memory cells. A write driver is connected to the memory array using digit lines connected to the bitlines of a column of the memory array. A write assist circuit is connected to the write driver using a wire bridge located in a metallization layer of the core.

BRIEF DESCRIPTION OF THE DRAWINGS

The devices and methods herein will be better understood from the following detailed description with reference to the drawings, which are not necessarily drawn to scale and in which.

DETAILED DESCRIPTION

Figure 1:
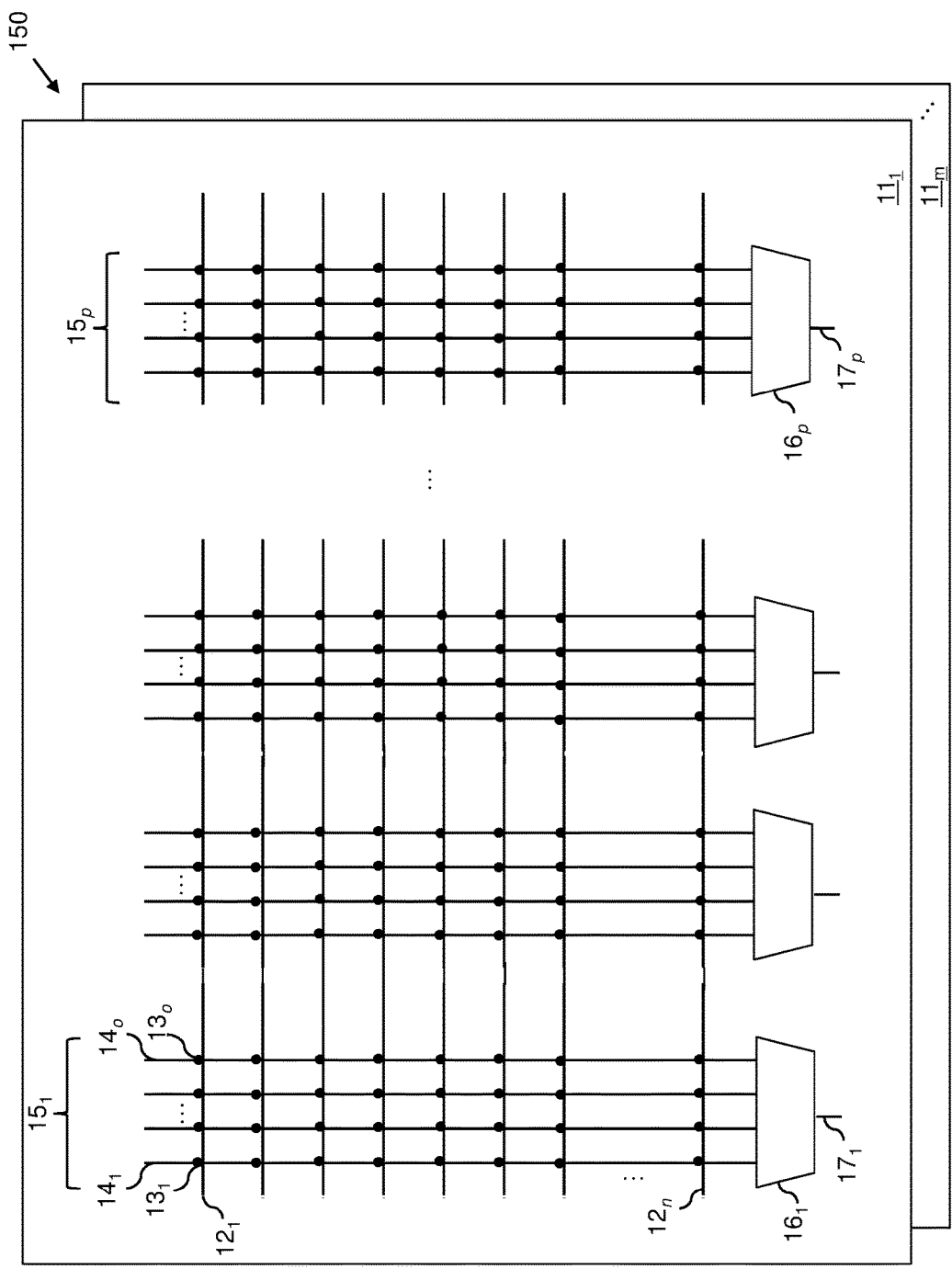
FIG. 1 is a schematic drawing illustrating an exemplary memory on an integrated circuit chip.

It will be readily understood that the devices and methods of the present disclosure, as generally described and illustrated in the drawings herein, may be arranged and designed in a wide variety of different configurations in addition to the devices and methods described herein. Thus, the following detailed description of the devices and methods, as represented in the drawings, is not intended to limit the scope defined by the appended claims but is merely representative of selected devices and methods. The following description is intended only by way of example, and simply illustrates certain concepts of the devices and methods, as disclosed and claimed herein.

Referring to FIG. 1, disclosed herein are embodiments of an integrated circuit chip having an array of memories, indicated generally as 150. More particularly, each of the memories in the memory array 150 can include one or more memory banks $11_1$-$11_m$, where the number m is the total number of banks and where each bank is essentially identical. Each memory bank $11_1$-$11_m$ can include one or more word lines $12_1$-$12_n$ (corresponding to rows), where the number n is the total number of word lines per bank. Each memory bank $11_1$-$11_m$ can also include one or more data bit columns $15_1$-$15_p$, where the number p is the total number of data bit columns per bank and where the data bit columns are essentially identical. Each data bit column $15_1$-$15_p$ can traverse the word lines $12_1$-$12_n$ so as to incorporate adjacent sections of the word lines $12_1$-$12_n$. Each data bit column $15_1$-$15_p$ can further include one or more memory cells $13_1$-$13_o$ electrically connected to each of those adjacent sections of the word lines $12_1$-$12_n$ and one or more bitlines $14_1$-$14_o$ (corresponding to columns) electrically connected to the memory cells $13_1$-$13_o$, respectively, at the adjacent sections of the word lines $12_1$-$12_n$. Thus, the number o corresponds to the number of memory cells electrically connected to each adjacent section of each word line in a data bit column as well as the corresponding number of bitlines connected to the memory cells in the data bit column. This number o is referred to herein as the decode number (i.e., a decode o). Each data bit column $15_1$-$15_p$ can, in the case of multiple bitlines (i.e., multiple columns) per data bit column, further include a corresponding multiplexer $16_1$-$16_p$ that receives, as inputs, signals from the bitlines $14_1$-$14_o$ and outputs a single data bit $17_1$-$17_p$, respectively. In such a memory, the number p of data bit columns is the same as the number p of single data bits output and is referred to as the data bit width. In order to read or write to the memory, a memory address of a set number of bits including bank address bits, which specify a particular one of the banks $11_1$-$11_m$, as well as word address bits and decode address bits, which in combination specify the same memory cell (i.e., the same particular word line and bitline intersection) to be accessed (i.e., read from or written to) in each of the data bit columns. The actual total address space is equal to the number m of banks multiplied by the number n of word lines per bank multiplied by the decode number o per data bit column.

The integrated circuit chip can include any number of two or more memories. The memories can be the same type of memories and can be configured, for example, as illustrated in FIG. 1. The memories can all be dynamic random access memory (DRAM) arrays, static random access memory (SRAM) arrays, or any other specific type of memory arrays, such as eDRAM, MRAM, Flash, etc. Each of these memories can further be associated with a predetermined maximum address space. For example, current state-of-the-art SRAM arrays have a maximum possible size of 16 banks, 512 word lines per bank and a decode number of 32 (i.e., a decode 32) and, thereby a maximum possible address space of 256,000 addresses.

These memories can have the exact same configuration (e.g., the same number of banks, the same number of word lines per bank and the same decode number per data bit column such that they each have the same total address space. Alternatively, any two or more of the memories can have different configurations (e.g., different numbers of banks, different numbers of word lines per bank and/or different decode numbers per data bit column) such that they have different total address spaces. For example, the memories can all include SRAM arrays; however, one memory can have 2 banks, each with 256 word lines and a decode number of 8 for a total address space of 4096 addresses; another memory can have 8 banks, each with 128 word lines and a decode number of 4 for a total address space of 4096 addresses; and yet another memory can have 4 banks, each with 16 word addresses and a decode number of 16 for a total address space of 1024 addresses. These are just examples. Any configuration of memories can be used, as would be known by one of ordinary skill in the art.

The design of an integrated circuit transforms a circuit description into a geometric description. The layout of the integrated circuit consists of a set of planar geometric shapes in the various layers of the silicon chip. Physical design requires arranging elements, wires, and predefined cells on a fixed area. An integrated circuit is designed with various functional blocks, or functions, which, operating together, achieves the desired operation. Each of the functions of the circuit is implemented by a plurality of cells and may be assigned a portion of the space upon which the cells are placed. Each microelectronic circuit device or cell includes a plurality of pins or terminals, each of which is connected to pins of other cells by a respective electrical interconnection wire network. During planning, the size of the IC chip, the placement of customized functional blocks, the placement of the area(s) for library elements, etc. can be determined. Those skilled in the art will recognize that a standard cell typically includes a group of one or more transistors and the interconnect structure(s) that connect those transistors and can provide a logic function or a storage function. The library elements can also be standard blocks for memories, core processors, etc. In any case, the library files (.libs) can contain library information about the library elements, respectively, and this library information can include, but is not limited to, the specific attributes of the library element (e.g., the transistors, interconnects, etc.), the pin characteristics (e.g., capacitance, timing, etc.) for the library element, the timing information for the library elements, and other library element-specific information. For example, as shown in FIG. 2A, functional areas of the IC chip can include a control area 202, a core 205 containing a memory array 150, a column circuit 208 that is associated with the memory array 150, and wordline driver circuit 211 that is associated with the memory array 150.

Figure 2B:
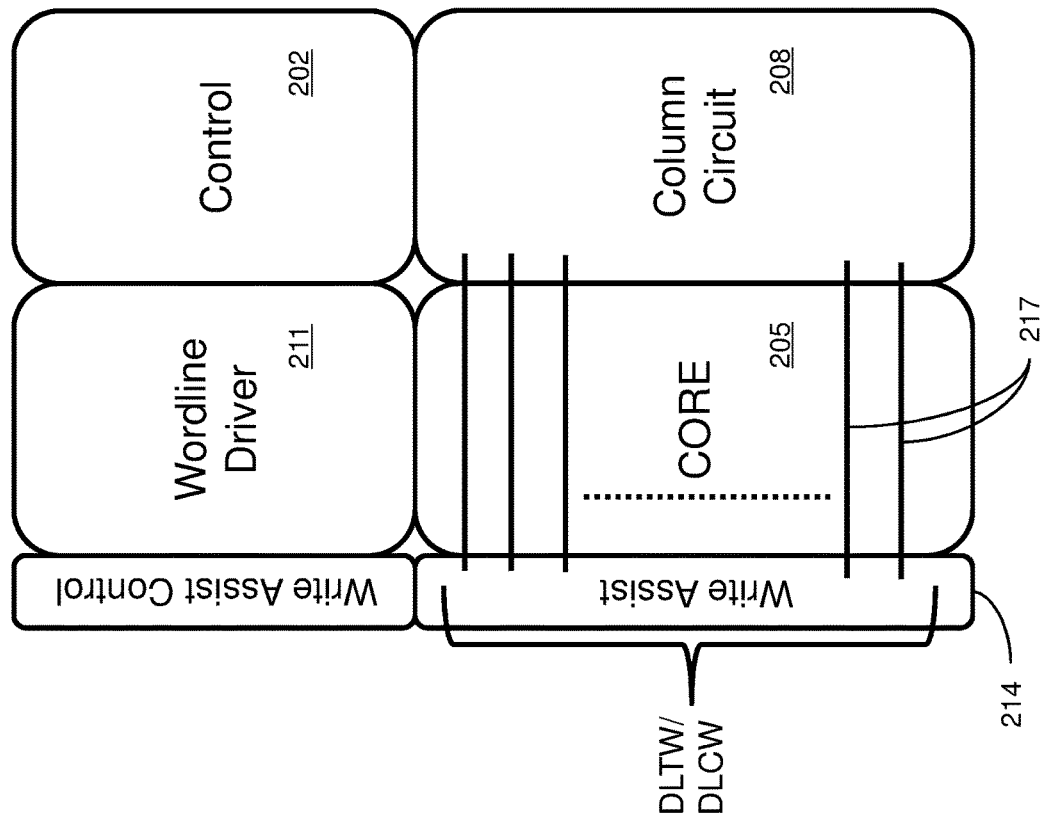
FIG. 2B shows a layout of components for an integrated circuit chip according to devices and methods herein.
Figure 2A:
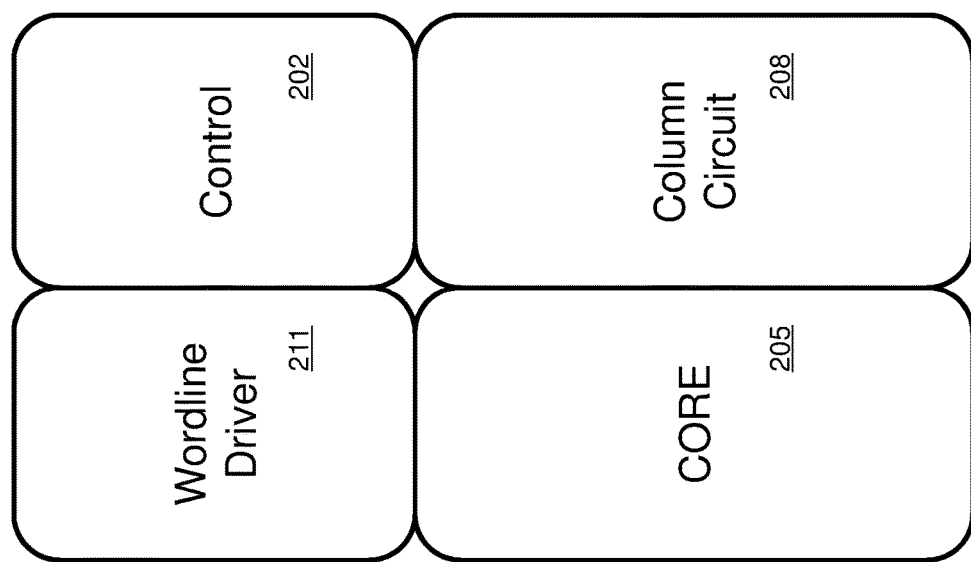
FIG. 2A shows a layout of components for a typical integrated circuit chip.

Referring to FIG. 2B, according to exemplary devices and methods herein, the core 205 may include a memory array 150 having memory cells and bitlines. The core may also include a metallization layer with connections to memory cells of the memory array 150. The metallization layer is devoid of memory cells. Examples of such cores may include, but are not limited to, bus interface cores, communications cores, digital signal processing cores, math cores, memory controller cores, processor cores, and peripheral cores, for example. According to some embodiments, digit lines are connected to the bitlines of a column of the memory array through column muxing NMOS transistors. A write driver is connected to the digit lines. A write assist 214 is connected to the write driver. The write assist 214 maintains a voltage on the digit lines prior to write operations and provides a boost voltage to the digit lines during write operations. A wire bridge 217 located in the metallization layer of the core connects the write assist to the write driver.

Figure 3:
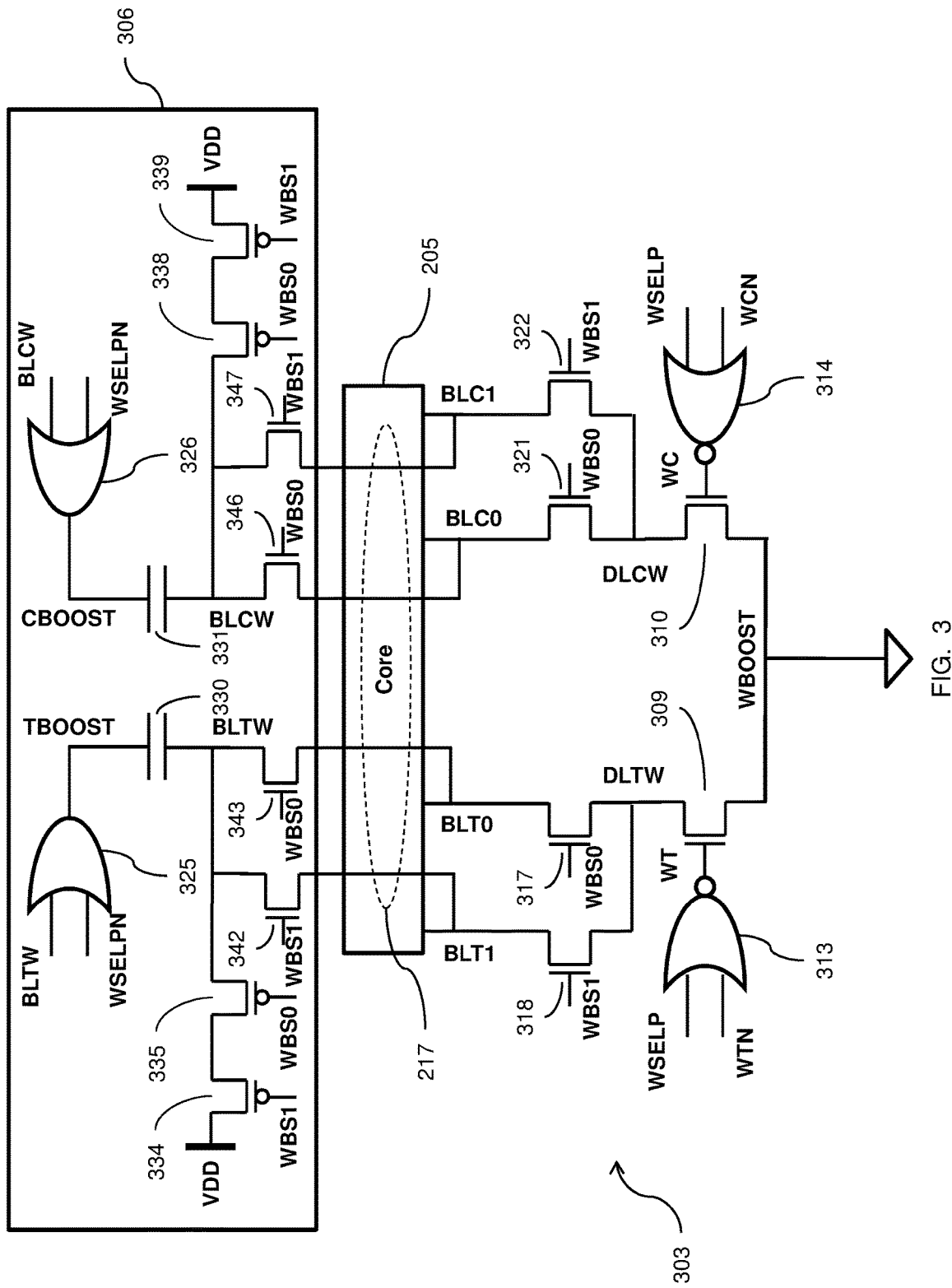
FIG. 3 is a schematic diagram of a write assist circuit according to devices and methods herein.

FIG. 3 illustrates a schematic diagram of write driver, generally designated 303, for an SRAM or DRAM cell as may be employed in the memory array 150 of FIG. 1. A write assist circuit 306 is connected to the write driver 303 by a wire bridge 217 located in a metallization layer of the core 205. The write driver 303 includes a first transistor 309 connected from the first digit line DLTW to ground and a second transistor 310 connected from the second digit line DLCW to ground. The first digit line DLTW is a true line and the second digit line DLCW is a complement line. Both the first transistor 309 and the second transistor 310 are NMOS transistors, which means they are normally OFF. The first transistor 309 is controlled by a first NOR gate 313 having a WSELP signal and a WTN signal as inputs. The second transistor 310 is controlled by a second NOR gate 314 having a WSELP signal and a WCN signal as inputs. True bitlines BLT0 and BLT1 are connected to the core 205 on one end and to ground through transistors 317 and 318, respectively, on the other end. Transistors 317 and 318 are NMOS transistors that are turned ON by write bit signals for their associated bitlines. Complement bitlines BLC0 and BLC1 are connected to the core 205 on one end and to ground through transistors 321 and 322, respectively, on the other end. Transistors 321 and 322 are NMOS transistors that are turned ON by write bit signals for their associated bitlines. The first transistor 309 and second transistor 310, being NMOS transistors, provide multiplexing (sometimes called muxing) of the write signal to columns of the core 205.

The write assist circuit 306 is connected to the write driver 303 by the wire bridge 217 located in a metallization layer of the core 205. The wire bridge 217 is located in a layer of the core 205 that is devoid of memory cells or other logic circuits. The write assist circuit 306 includes a first OR gate 325 that provides a TBOOST (true boost) signal to the true bitlines BLT0 and BLT1 and a second OR gate 326 that provides a CBOOST (complement boost) signal to the complement bitlines BLC0 and BLC1. The first OR gate 325 has a BLTW signal and a WSELPN signal as inputs and the second OR gate 326 has a BLCW signal and a WSELPN signal for inputs. The first OR gate 325 and second OR gate 326 are connected to their respective write bitlines through separate capacitors 330, 331, respectively. The write bitlines may be precharged to VDD through separate PMOS transistors 334 and 335 for the true bitlines BLT0 and BLT1 and PMOS transistors 338 and 339 for the complement bitlines BLC0 and BLC1. These PMOS transistors are normally ON until a write bit signal is received. Each write bitline also includes a pass transistor 342 and 343 for the true bitlines BLT0 and BLT1 and pass transistor 346 and 347 for the complement bitlines BLC0 and BLC1. The pass transistors 342, 343, 346, 347 are NMOS transistors, which are normally OFF until a write bit signal is received. According to devices and methods herein, the write assist circuit 306 can be added as an extra block of logic to an already existing design without circuit disruption, which helps to integrate the write assist feature into the design.

In writing to a bit cell, the Bitline True (BLTW) or Bitline Complement (BLCW) is pulled to ground as fast as possible and then a negative bitline boost is applied for additional write assist. In the embodiment illustrated in FIG. 3, BLTW and BLCW are precharged when not performing a write operation. TBOOST and CBOOST are high before writing as WSELP is low. During a write operation, either of BLTW or BLCW will be pulled low, based on node values for WT and WC from the first NOR gate 313 and the second NOR gate 314, respectively. Then, based on which node goes low, TBOOST or CBOOST will go low. This will reverse the voltages across the capacitor 330, 331 for the respective write digit line, causing the digit line to go low. During a write operation using write assist, the write bit signal (WBS0, WBS1) removes the precharge by turning OFF PMOS transistors 334, 335, 338, 339 and simultaneously turning ON pass transistors 342, 343, 346, 347, which allows the TBOOST or CBOOST to pull the respective digit lines low. A single clock signal is used with the write driver 303 to predischarge the capacitors 330, 331 prior to boosting. In this case, WSELP is tuned to the timing when write assist boosting is employed. Bitlines BLTW and BLCW provide feedback in the write assist circuit 306, such that write assist is disabled when not needed. The write assist circuit 306 enables the far side of the bitlines to receive maximum assist, which minimizes reliability concern and improves chip yield.

Figure 4:
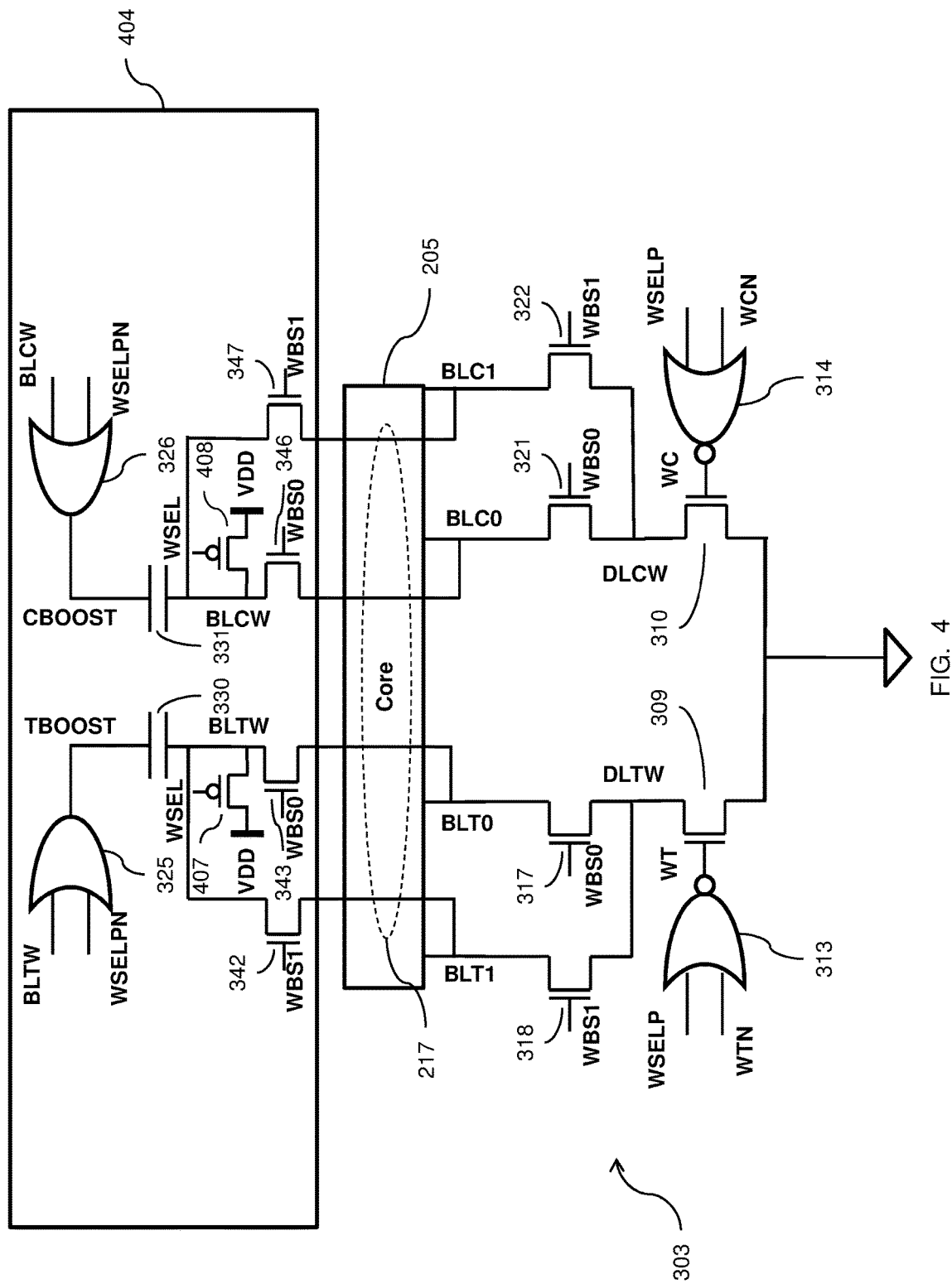
FIG. 4 is a schematic diagram of a write assist circuit according to devices and methods herein.

FIG. 4 shows the same write driver 303 as illustrated in FIG. 3. A write assist circuit 404 is connected to the write driver 303 by a wire bridge 217 located in a metallization layer of the core 205. The write driver 303 includes a first transistor 309 connected from the first digit line DLTW to ground and a second transistor 310 connected from the second digit line DLCW to ground. The first digit line DLTW is a true line and the second digit line DLCW is a complement line. Both the first transistor 309 and the second transistor 310 are NMOS transistors, which means they are normally OFF. The first transistor 309 is controlled by a first NOR gate 313 having a WSELP signal and a WTN signal as inputs. The second transistor 310 is controlled by a second NOR gate 314 having a WSELP signal and a WCN signal as inputs. True bitlines BLT0 and BLT1 are connected to the core 205 on one end and to ground through transistors 317 and 318, respectively, on the other end. Transistors 317 and 318 are NMOS transistors that are turned ON by write signals for their associated bitlines. Complement bitlines BLC0 and BLC1 are connected to the core 205 on one end and to ground through transistors 321 and 322, respectively, on the other end. Transistors 321 and 322 are NMOS transistors that are turned ON by write signals for their associated bitlines. The first transistor 309 and second transistor 310, being NMOS transistors, provide multiplexing (sometimes called muxing) of the write signal to columns of the core 205.

The write assist circuit 404 is connected to the write driver 303 by the wire bridge 217 located in a metallization layer of the core 205. The wire bridge 217 is located in a layer of the core 205 that is devoid of memory cells or other logic circuits. The write assist circuit 404 is similar to write assist circuit 306 and includes the first OR gate 325 that provides a TBOOST signal to the true bitlines BLT0 and BLT1 and the second OR gate 326 that provides a CBOOST signal to the complement bitlines BLC0 and BLC1. The first OR gate 325 has a BLTW signal and a WSELPN signal as inputs and the second OR gate 326 has a BLCW signal and a WSELPN signal for inputs. The first OR gate 325 and second OR gate 326 are connected to their respective write digit lines through separate capacitors 330, 331, respectively. In this case, the write assist circuit 404 includes PMOS transistors 407, 408, which are controlled by the write select (WSEL) signal. These PMOS transistors are normally ON until a WSEL signal is received. Each write bitline also includes a pass transistor 342 and 343 for the true bitlines BLT0 and BLT1 and pass transistor 346 and 347 for the complement bitlines BLC0 and BLC1. The pass transistors 342, 343, 346, 347 are NMOS transistors, which are normally OFF until a write bit signal is received. The write bitlines may be precharged to VDD through PMOS transistors 407, 408. According to devices and methods herein, the write assist circuit 404 can be added as an extra block of logic to an already existing design without circuit disruption, which helps to integrate the write assist feature into the design.

In the embodiment illustrated in FIG. 4, BLTW and BLCW are precharged when not performing a write operation. TBOOST and CBOOST are high before writing as WSELP is low. During a write operation, either of BLTW or BLCW will be pulled low, based on node values for WT and WC from the first NOR gate 313 and the second NOR gate 314, respectively. Then, based on which node goes low, TBOOST or CBOOST will go low. This will reverse the voltages across the capacitor 330, 331 for the respective write digit line, causing the digit line to go low. During a write operation using write assist, the write select signal (WSEL) removes the precharge by turning OFF PMOS transistors 407, 408 while the write bit signal (WBS0, WBS1) simultaneously turns ON pass transistors 342, 343, 346, 347, which allows the TBOOST or CBOOST to pull the respective digit lines low. A single clock signal is used with the write driver 303 to predischarge the capacitors 330, 331 prior to boosting. WSELP is tuned to the timing when write assist boosting is employed. Bitlines BLTW and BLCW provide feedback in the write assist circuit 306, such that write assist is disabled when not needed. In this case, PMOS transistors 407, 408 maintain a voltage on the bitlines BLTW and BLCW while ensuring that half-selected cells are not boosted. The write assist circuit 404 enables the far side of the bitlines to receive maximum assist, which minimizes reliability concern and improves chip yield.

Figure 5:
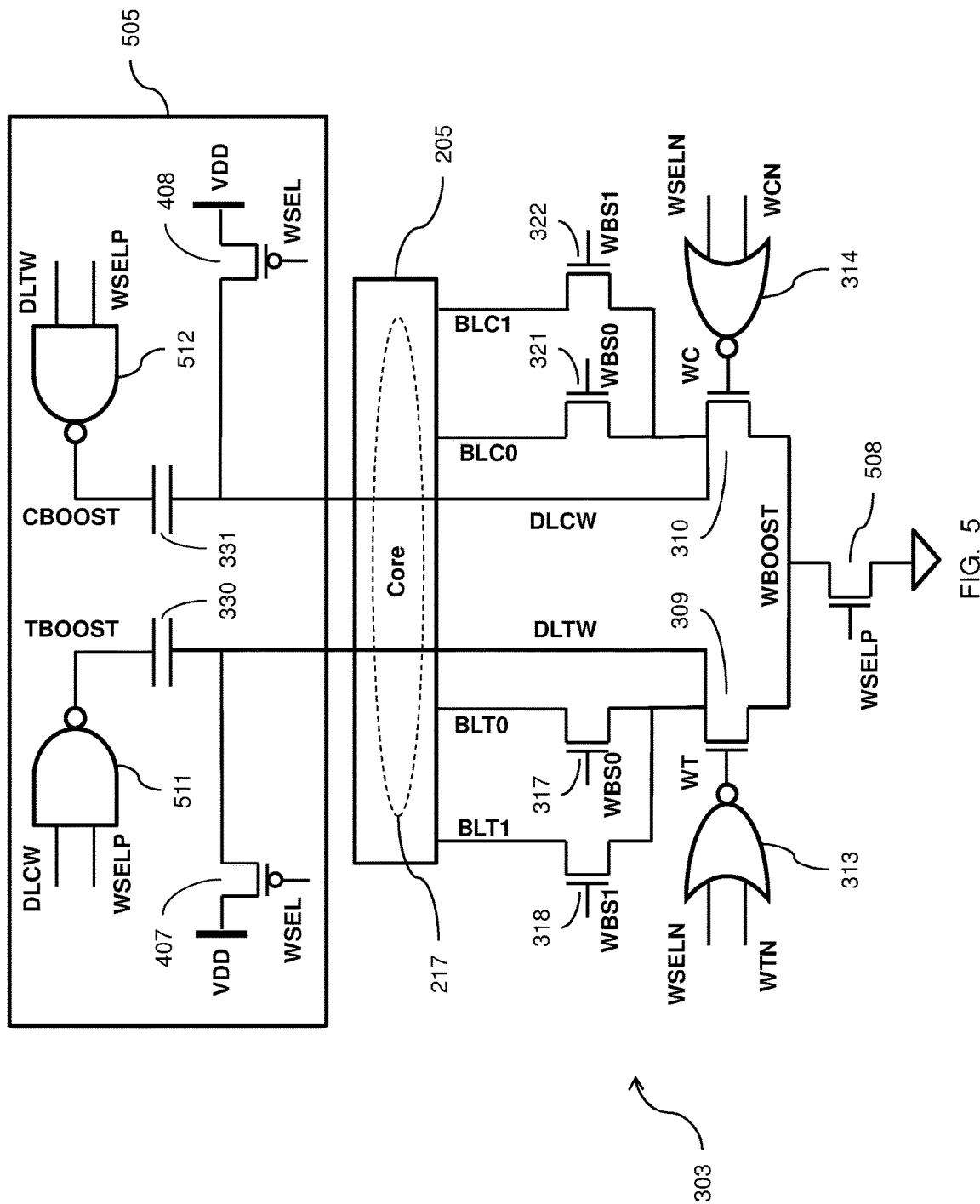
FIG. 5 is a schematic diagram of a write assist circuit according to devices and methods herein.

FIG. 5 shows the same write driver 303 as illustrated in FIGS. 3 and 4. A write assist circuit 505 is connected to the write driver 303 by a wire bridge 217 located in a metallization layer of the core 205. The write driver 303 includes a first transistor 309 connected from the first digit line DLTW to ground and a second transistor 310 connected from the second digit line DLCW to ground. The first digit line DLTW is a true line and the second digit line DLCW is a complement line. Both the first transistor 309 and the second transistor 310 are NMOS transistors, which means they are normally off. The first transistor 309 is controlled by a first NOR gate 313 having a WSELP signal and a WTN signal as inputs. The second transistor 310 is controlled by a second NOR gate 314 having a WSELP signal and a WCN signal as inputs. True bitlines BLT0 and BLT1 are connected to the core 205 on one end and to ground through transistors 317 and 318, respectively, on the other end. Transistors 317 and 318 are NMOS transistors that are turned ON by write signals for their associated bitlines. Complement bitlines BLC0 and BLC1 are connected to the core 205 on one end and to ground through transistors 321 and 322, respectively, on the other end. Transistors 321 and 322 are NMOS transistors that are turned ON by write signals for their associated bitlines. The first transistor 309 and second transistor 310, being NMOS transistors, provide multiplexing (sometimes called muxing) of the write signal to columns of the core 205. An NMOS transistor 508 may be provided in order to control grounding of the first digit line DLTW and the second digit line DLCW.

The write assist circuit 505 is connected to the write driver 303 by the wire bridge 217 located in a metallization layer of the core 205. The wire bridge 217 is located in a layer of the core 205 that is devoid of memory cells or other logic circuits. The write assist circuit 505 includes a first NAND gate 511 that provides a TBOOST signal to the true digit line DLTW and a second NAND gate 512 that provides a CBOOST signal to the complement digit line DLCW. The first NAND gate 511 has a DLCW signal and a WSELPN signal as inputs and the second NAND gate 512 has a DLTW signal and a WSELPN signal for inputs. The first NAND gate 511 and second NAND gate 512 are connected to their respective write digit lines through separate capacitors 330, 331, respectively. (Note that the complement digit write line DLCW provides an input to the first NAND gate 511, which is connected to the true digit write line and the true digit write line DLTW provides an input to the second NAND gate 512, which is connected to the complement digit write line.) As shown in FIG. 5, the write assist circuit 505 includes PMOS transistors 407, 408, which are controlled by the write select (WSEL) signal. These PMOS transistors are normally ON until a WSEL signal is received. The write bitlines may be precharged to VDD through PMOS transistors 407, 408. According to devices and methods herein, the write assist circuit 505 can be added as an extra block of logic to an already existing design without circuit disruption, which helps to integrate the write assist feature into the design.

In the embodiment illustrated in FIG. 5, DLTW and DLCW are precharged through PMOS transistors 407, 408 when not performing a write operation. TBOOST and CBOOST are high before writing as WSELP is low. During a write operation, either of DLTW or DLCW will be pulled low, based on node values for WT and WC from the first NOR gate 313 and the second NOR gate 314, respectively. Then, based on which node goes low, TBOOST or CBOOST will go low. This will reverse the voltages across the capacitor 330, 331 for the respective write digit line, causing the digit line to go low. During a write operation using write assist, the write select signal (WSEL) removes the precharge by turning OFF PMOS transistors 407, 408. The PMOS transistors 407, 408 maintain a precharge voltage on the digit lines DLTW and DLCW prior to write operations instead of leaving them floating. Digit lines DLTW and DLCW provide feedback in the write assist circuit 505, such that write assist is disabled when not needed. A single clock signal is used with the write driver 303 to predischarge the capacitors 330, 331 prior to boosting. WSELP is tuned to the timing of WBS when write assist boosting is employed. The node values for WT and WC are clocked with the WSEL signal to avoid a current path while digit lines DLTW and DLCW are precharged. The write assist circuit 505 enables the far side of the bitlines to receive maximum assist, which minimizes reliability concern and improves chip yield.

Figure 6:
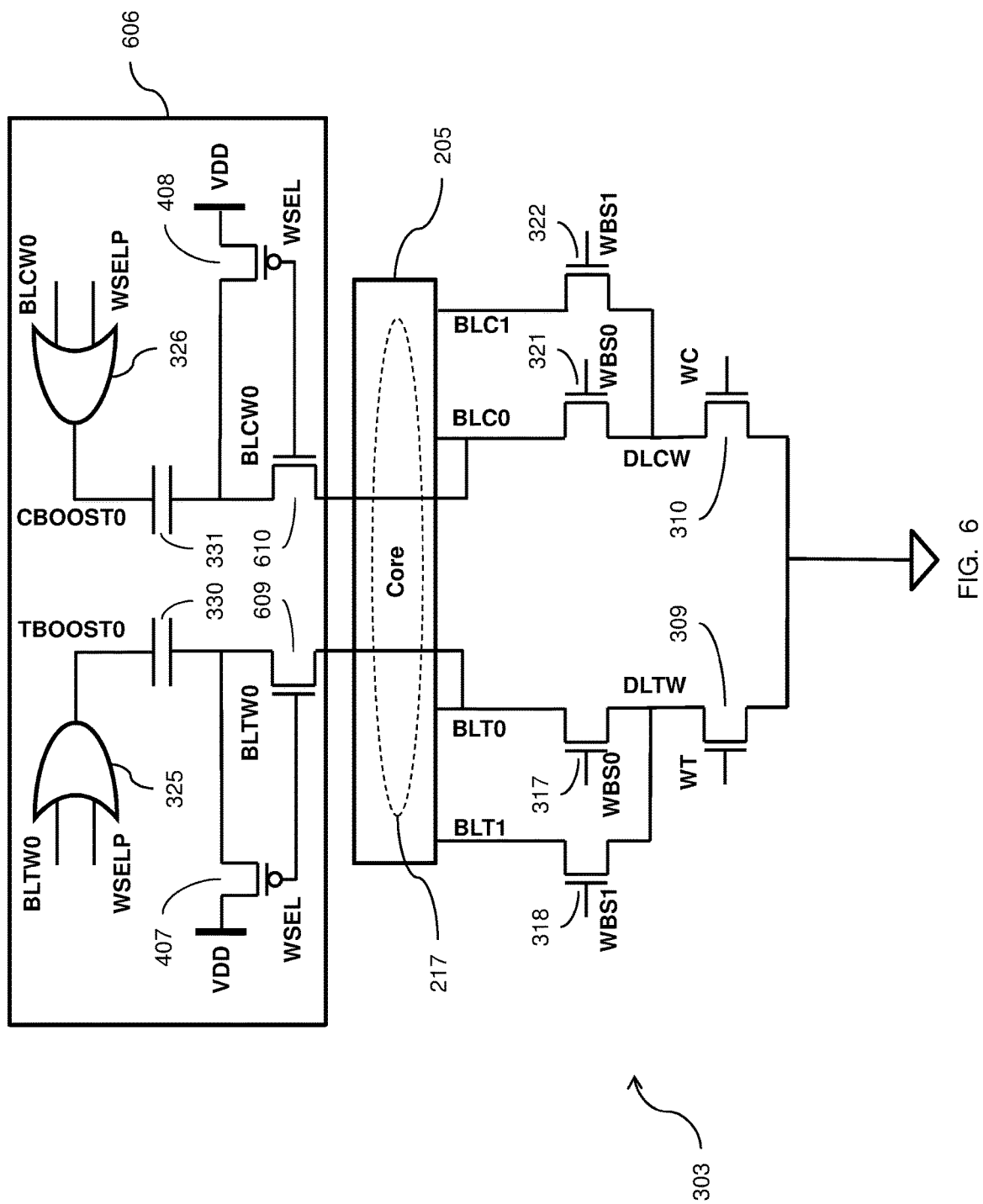
FIG. 6 is a schematic diagram of a write assist circuit according to devices and methods herein.

FIG. 6 shows a write driver 303 similar to the one illustrated in FIGS. 3, 4, and 5. A write assist circuit 606 is connected to the write driver 303 by a wire bridge 217 located in a metallization layer of the core 205. The wire bridge 217 is located in a layer of the core 205 that is devoid of memory cells or other logic circuits. The write driver 303 includes a first transistor 309 connected from the first digit line DLTW to ground and a second transistor 310 connected from the second digit line DLCW to ground. The first digit line DLTW is a true line and the second digit line DLCW is a complement line. Both the first transistor 309 and the second transistor 310 are NMOS transistors, which means they are normally OFF. True bitlines BLT0 and BLT1 are connected to the core 205 on one end and to ground through transistors 317 and 318, respectively, on the other end. Transistors 317 and 318 are NMOS transistors that are turned ON by write signals for their associated bitlines. Complement bitlines BLC0 and BLC1 are connected to the core 205 on one end and to ground through transistors 321 and 322, respectively, on the other end. Transistors 321 and 322 are NMOS transistors that are turned ON by write signals for their associated bitlines. The first transistor 309 and second transistor 310, being NMOS transistors, provide multiplexing (sometimes called muxing) of the write signal to columns of the core 205.

The write assist circuit 606 is connected to the write driver 303 by the wire bridge 217 located in a metallization layer of the core 205. The write assist circuit 606 includes a first OR gate 325 that provides a TBOOST0 signal to the true write bitlines BLTW0 and a second OR gate 326 that provides a CBOOST0 signal to the complement write bitlines BLCW0. The first OR gate 325 has a BLTW0 signal and a WSELPN signal as inputs and the second OR gate 326 has a BLCW0 signal and a WSELPN signal for inputs. The first OR gate 325 and second OR gate 326 are connected to their respective write bitlines through separate capacitors 330, 331, respectively. As shown in FIG. 6, the write assist circuit 606 includes PMOS transistors 407, 408, which are controlled by the write select (WSEL) signal. These PMOS transistors are normally ON until a WSEL signal is received. The write bitlines BLTW0, BLCW0 may be precharged to VDD through PMOS transistors 407, 408. Each write bitline BLT0 and BLC0 includes a pass transistor 609, 610, which are also controlled by the WSEL signal. Bitlines BLT1 and BLC1 similarly include pass transistors controlled by the WSEL signal. For clarity, these additional pass transistors are not shown in order to avoid cluttering the drawings. According to devices and methods herein, the write assist circuit 606 can be added as an extra block of logic to an already existing design without circuit disruption, which helps to integrate the write assist feature into the design.

In the embodiment illustrated in FIG. 6, BLTW0 and BLCW0 are precharged through PMOS transistors 407, 408 when not performing a write operation. TBOOST0 and CBOOST0 are high before writing as WSELP is low. During a write operation, either of BLTW or BLCW will be pulled low, based on node values for WT and WC. Then, based on which node goes low, TBOOST0 or CBOOST0 will go low. This will reverse the voltages across the capacitor 330, 331 for the respective write digit line, causing the digit line to go low. During a write operation using write assist, the write select signal (WSEL) removes the precharge by turning OFF PMOS transistors 407, 408 while simultaneously turning ON pass transistors 609, 610, which allows the TBOOST0 or CBOOST0 to pull the respective bitlines low. The PMOS transistors 407, 408 maintain a precharge voltage on the bitlines BLTW0 and BLCW0 prior to write operations instead of leaving them floating. Bitlines BLTW0 and BLCW0 provide feedback in the write assist circuit 606, such that write assist is disabled when not needed. A single clock signal is used with the write driver 303 to predischarge the capacitors 330, 331 prior to boosting. WSELP is tuned to the timing of WBS when write assist boosting is employed. The node values for WT and WC are clocked with the WSEL signal to avoid a current path while digit lines DLTW and DLCW are precharged. The write assist circuit 606 enables the far side of the bitlines to receive maximum assist, which minimizes reliability concern and improves chip yield.

Figure 7:
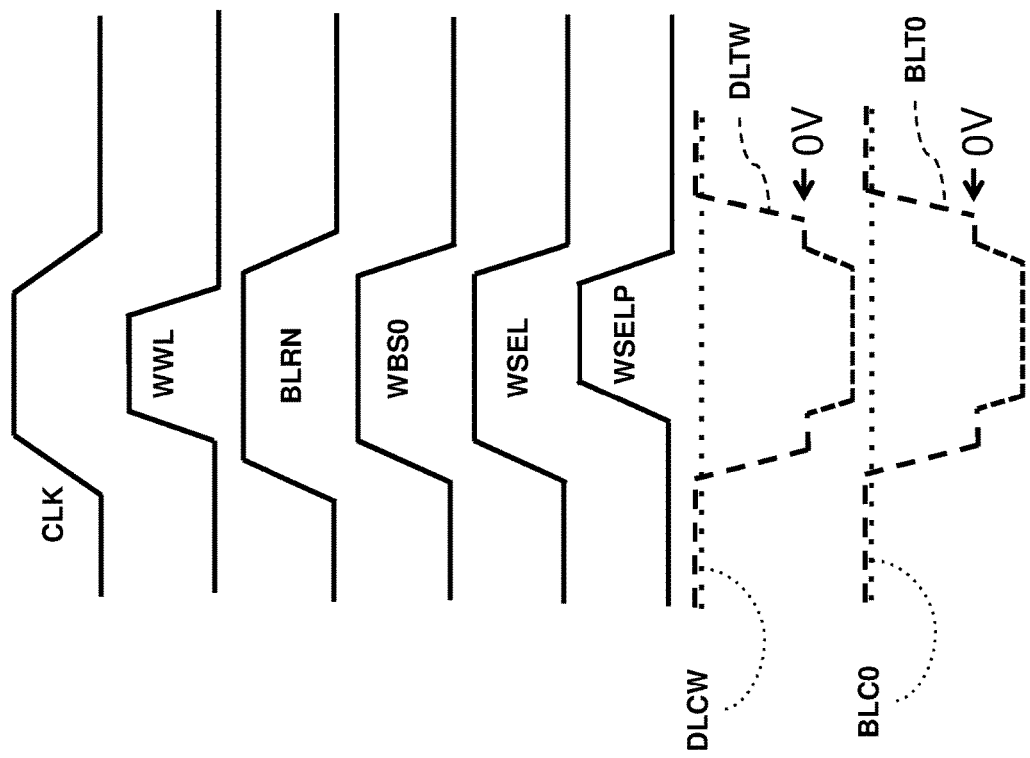
FIG. 7 is a timing diagram according to devices and methods herein.

FIG. 7 is an exemplary timing diagram according to devices and methods herein. The true write digit line DLTW and complement write digit line DLCW are initially held high, as are true bitline BLT0 and Complement bitline BLC0. As shown in FIG. 7, upon receipt of a WSEL signal, the voltage on the true write digit line DLTW is pulled to 0 volts and the voltage on true write bitline BLT0 is pulled to 0 volts. With write assist, the voltage on the true write digit line DLTW is pulled more negative and the voltage on true write bitline BLT0 is pulled more negative. Note that a single clock is used and the write driver is used to predischarge the boost cap prior to boosting.

Figure 8:
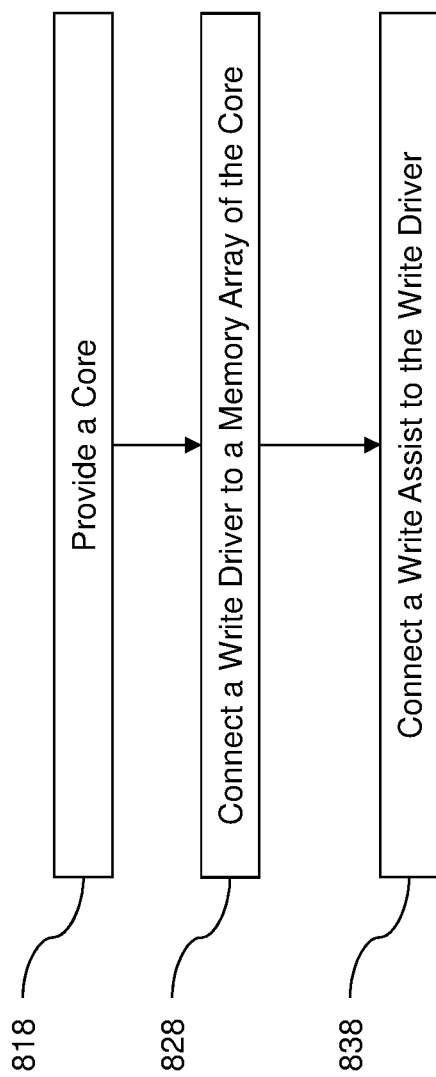
FIG. 8 is a flow diagram illustrating devices and methods herein.

FIG. 8 is a flow diagram illustrating the processing flow of an exemplary method according to devices and methods herein. At 818, a core is provided. The core has a memory array that includes memory cells and bitlines. The memory array is arranged in columns. The core also includes a metallization layer with connections to the memory cells, but the metallization layer is devoid of memory cells. At 828, a write driver is connected to the memory array using digit lines connected to the bitlines of a column of the memory array. The digit lines are connected to the bitlines through column muxing NMOS transistors. At 838, a write assist circuit is connected to the write driver using a wire bridge located in a metallization layer of the core.

The method as described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

For electronic applications, semiconducting substrates, such as silicon wafers, can be used. The substrate enables easy handling of the micro device through the many fabrication steps. Often, many individual devices are made together on one substrate and then singulated into separated devices toward the end of fabrication. In order to fabricate a microdevice, many processes are performed, one after the other, many times repeatedly. These processes typically include depositing a film, patterning the film with the desired micro features, and removing (or etching) portions of the film. For example, in memory chip fabrication, there may be several lithography steps, oxidation steps, etching steps, doping steps, and many others are performed. The complexity of microfabrication processes can be described by their mask count.

The terminology used herein is for the purpose of describing particular devices and methods only and is not intended to be limiting of this disclosure. As used herein, the singular forms "a", "an", and "the" are intended to include the plural forms as well, unless the context clearly indicates otherwise. It will be further understood that the terms "comprises", "comprising", "includes", and "including", when used in this specification, specify the presence of stated features, integers, steps, operations, elements, and/or components, but do not preclude the presence or addition of one or more other features, integers, steps, operations, elements, components, and/or groups thereof.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The corresponding structures, materials, acts, and equivalents of all means or step plus function elements in the claims below are intended to include any structure, material, or act for performing the function in combination with other claimed elements as specifically claimed. The descriptions of the various devices and methods herein have been presented for purposes of illustration but are not intended to be exhaustive or limited to the devices and methods disclosed. Many modifications and variations will be apparent to those of ordinary skill in the art without departing from the scope and spirit of the described devices and methods. The terminology used herein was chosen to best explain the principles of the devices and methods, the practical application or technical improvement over technologies found in the marketplace, or to enable others of ordinary skill in the art to understand the devices and methods disclosed herein.

What is claimed is:

1. A device, comprising:
   a core comprising a memory array, the memory array comprising memory cells having bitlines, the memory array being arranged in columns, wherein the core includes a metallization layer comprising connections to the memory array, and wherein the metallization layer is devoid of memory cells;
   digit lines connected to the bitlines of a column of the memory array;
   a write driver connected to the digit lines;
   a write assist circuit connected to the write driver; and
   a wire bridge located in the metallization layer of the core connecting the write assist circuit to the write driver,
   the write assist circuit comprising:
      a first precharge transistor connected to a first digit line, the first precharge transistor maintaining a first voltage on the first digit line prior to write operations,
      a second precharge transistor connected to a second digit line, the second precharge transistor maintaining a second voltage on the second digit line prior to write operations,
      a first boost signal connected to the first digit line, the first boost signal providing a first boost voltage to the first digit line during write operations, and
      a second boost signal connected to the second digit line, the second boost signal providing a second boost voltage to the second digit line during write operations.

2. The device according to claim 1, wherein the write driver is connected from the first digit line and the second digit line to each of the memory cells of the memory array.

3. The device according to claim 1, wherein the write driver further comprises:
   a first transistor connected from the first digit line to ground, and
   a second transistor connected from the second digit line to ground.

4. The device according to claim 1, wherein the digit lines are connected to the bitlines through column muxing transistors.

5. The device according to claim 1, wherein
   the first boost signal comprises a true boost signal connected to a true digit line, and
   the second boost signal comprises a complement boost signal connected to a complement digit line,
   the write assist circuit further comprising:
      a first capacitor connected to the true boost signal, and
      a second capacitor connected to the complement boost signal, the first capacitor being different from the second capacitor.

6. The device according to claim 5, wherein a single clock signal is used and the write driver predischarges the first capacitor and the second capacitor prior to providing write assist.

7. The device according to claim 5, the write assist circuit further comprising:
   a first logic gate connected to the first digit line providing a boost voltage to the first digit line during write operations, and
   a second logic gate connected to the second digit line providing a boost voltage to the second digit line during write operations, the first logic gate and second logic gate being the same type of logic gate.

8. The device according to claim 7, wherein boosting of the digit lines is based on feedback from the digit lines to the first logic gate and the second logic gate.

9. A device, comprising:
   a core comprising a memory array, the memory array comprising memory cells having bitlines, the memory array being arranged in columns, wherein the core includes a metallization layer comprising connections to the memory array, and wherein the metallization layer is devoid of memory cells;
   digit lines connected to the bitlines of a column of the memory array;
   a write driver connected from a first digit line and a second digit line to each of the memory cells of the memory array, the write driver comprising:
      a first transistor connected from the first digit line to ground, and
      a second transistor connected from the second digit line to ground; and
   a write assist circuit connected to the write driver, wherein a wire bridge located in the metallization layer of the core connects the write assist circuit to the write driver, the write assist circuit comprising:

a first precharge transistor connected to the first digit line, the first precharge transistor maintaining a first voltage on the first digit line prior to write operations, a second precharge transistor connected to the second digit line, the second precharge transistor maintaining a second voltage on the second digit line prior to write operations, a first boost signal connected to the first digit line, the first boost signal providing a first boost voltage to the first digit line during write operations, and a second boost signal connected to the second digit line, the second boost signal providing a second boost voltage to the second digit line during write operations.

10. The device according to claim 9, wherein the digit lines are connected to the bitlines through column muxing transistors.

11. The device according to claim 9, wherein
the first boost signal comprises a true boost signal connected to a true digit line, and
the second boost signal comprises a complement boost signal connected to a complement digit line,
the write assist circuit further comprising:
a first capacitor connected to the true boost signal, and
a second capacitor connected to the complement boost signal, the first capacitor being different from the second capacitor.

12. The device according to claim 11, wherein a single clock signal is used and the write driver predischarges the first capacitor and the second capacitor prior to providing write assist.

13. The device according to claim 11, the write assist circuit further comprising:
a first logic gate connected to the first digit line providing a boost voltage to the first digit line during write operations, and
a second logic gate connected to the second digit line providing a boost voltage to the second digit line during write operations, the first logic gate and second logic gate being the same type of logic gate.

14. The device according to claim 13, wherein boosting of the digit lines is based on feedback from the digit lines to the first logic gate and the second logic gate.

15. A method, comprising:
providing a core comprising a memory array, the memory array comprising memory cells having bitlines, the memory array being arranged in columns, the core further comprising a metallization layer comprising connections to the memory array, and wherein the metallization layer is devoid of memory cells;

connecting a write driver to the memory array using digit lines connected to the bitlines of a column of the memory array through column muxing transistors; and connecting a write assist circuit to the write driver using a wire bridge located in a metallization layer of the core, the write assist circuit comprising:
a first precharge transistor connected to a first digit line, the first precharge transistor maintaining a first voltage on the first digit line prior to write operations, and
a second precharge transistor connected to a second digit line, the second precharge transistor maintaining a second voltage on the second digit line prior to write operations.

16. The method according to claim 15, the write assist circuit further comprising:
a first boost signal connected to the first digit line, the first boost signal providing a first boost voltage to the first digit line during write operations, and
a second boost signal connected to the second digit line, the second boost signal providing a second boost voltage to the second digit line during write operations.

17. The method according to claim 16, wherein a single clock signal is used, and the write driver removes the first voltage and the second voltage prior to providing the first boost signal and the second boost signal.

18. The method according to claim 16, wherein
the first boost signal comprises a true boost signal connected to a true digit line, and
the second boost signal comprises a complement boost signal connected to a complement digit line,
the write assist circuit further comprising:
a first capacitor connected to the true boost signal, and
a second capacitor connected to the complement boost signal, the first capacitor being different from the second capacitor.

19. The method according to claim 18, the write assist circuit further comprising:
a first logic gate connected to the first digit line providing a boost voltage to the first digit line during write operations, and
a second logic gate connected to the second digit line providing a boost voltage to the second digit line during write operations.

20. The method according to claim 19, further comprising:
receiving feedback from the digit lines to each of the first logic gate and the second logic gate, and
boosting said first digit line and said second digit line based on said feedback.

* * * * *